United States Patent
Reddy et al.

(10) Patent No.: US 6,191,998 B1
(45) Date of Patent: *Feb. 20, 2001

(54) PROGRAMMABLE LOGIC DEVICE MEMORY ARRAY CIRCUIT HAVING COMBINABLE SINGLE-PORT MEMORY ARRAYS

(75) Inventors: Srinivas T. Reddy, Fremont; Christopher F. Lane, Campbell; Manuel Mejia, San Jose, all of CA (US)

(73) Assignee: Altera Corporation, San Jose, CA (US)

(*) Notice: Under 35 U.S.C. 154(b), the term of this patent shall be extended for 0 days.

This patent is subject to a terminal disclaimer.

(21) Appl. No.: 09/452,627

(22) Filed: Dec. 1, 1999

Related U.S. Application Data

(63) Continuation-in-part of application No. 09/107,926, filed on Jun. 30, 1998.
(60) Provisional application No. 60/061,983, filed on Oct. 16, 1997.

(51) Int. Cl.[7] .................................. G11C 8/00; G11C 7/00
(52) U.S. Cl. .............................. 365/230.05; 365/189.04; 365/189.08
(58) Field of Search .................. 365/230.05, 189.08, 365/189.04

(56) References Cited

U.S. PATENT DOCUMENTS

| Re. 34,363 | 8/1993 | Freeman ........................... 307/465 |
| 3,473,160 | 10/1969 | Wahlstrom ..................... 340/172.5 |
| 4,593,373 | 6/1986 | Kiuchi et al. ..................... 364/736 |
| 4,609,986 | 9/1986 | Hartmann et al. ............... 364/200 |
| 4,617,479 | 10/1986 | Hartmann et al. ............... 307/465 |

(List continued on next page.)

FOREIGN PATENT DOCUMENTS

| 0 156 316 | 2/1985 | (EP) | ............................ G11C/8/00 |
| 0 306 726 | 3/1989 | (EP) | ............................ G11C/7/00 |
| 0 509 135 | 10/1992 | (EP) | ............................ B60L/9/00 |
| 0 780 846 | 6/1997 | (EP) | ............................ G11C/5/00 |

OTHER PUBLICATIONS

*1999 Xilinx Databook*, 1999, Xilinx, Inc., San Jose, California.

R. C. Minnick, "A Survey of Microcellular Research," Journal of the Association for Computing Machinery, vol. 14, No. 2, pp. 203–241, Apr. 1967.

(List continued on next page.)

*Primary Examiner*—Trong Phan
(74) *Attorney, Agent, or Firm*—Fish & Neave; Robert R. Jackson; Khue V. Hoang

(57) ABSTRACT

A programmable logic device memory array circuit is provided that contains a pair of associated combinable single-port memory arrays. The memory array circuit may have a variable depth and width. The combinable single-port memory arrays may be operated independently if desired. Alternatively, a pair of the combinable single-port memory arrays can be combined to form a dual-port memory array. When the single-port memory arrays are combined to form a dual-port memory array, circuitry from a first of the combinable single-port memory arrays is used to perform writing operations and circuitry from a second of the combinable single-port memory arrays is used to perform reading operations. The availability of the dual-port memory array capability allows users to implement circuits such as first-in-first-out buffers and other circuits that require the ability to perform concurrent read and write operations. When such a dual-port capability is not required, two single-port memory arrays are available to implement a desired logic design.

12 Claims, 10 Drawing Sheets

U.S. PATENT DOCUMENTS

| | | | |
|---|---|---|---|
| 4,642,487 | 2/1987 | Carter | 307/465 |
| 4,677,318 | 6/1987 | Veenstra | 307/465 |
| 4,713,792 | 12/1987 | Hartmann et al. | 364/900 |
| 4,751,671 | 6/1988 | Babetski et al. | 364/900 |
| 4,758,745 | 7/1988 | Elgamal et al. | 307/465 |
| 4,774,421 | 9/1988 | Hartmann et al. | 307/465 |
| 4,871,930 | 10/1989 | Wong et al. | 307/465 |
| 4,899,067 | 2/1990 | So et al. | 307/465 |
| 4,912,342 | 3/1990 | Wong et al. | 307/465 |
| 4,942,541 | 7/1990 | Hoel et al. | 364/519 |
| 4,975,601 | 12/1990 | Steele | 307/465 |
| 5,027,326 | 6/1991 | Jones | 365/221 |
| 5,121,006 | 6/1992 | Pedersen | 307/465 |
| 5,128,559 | 7/1992 | Steele | 307/465 |
| 5,146,428 | 9/1992 | Tanimura | 365/189.08 |
| 5,220,214 | 6/1993 | Pedersen | 307/465 |
| 5,258,668 | 11/1993 | Cliff et al. | 307/465 |
| 5,260,610 | 11/1993 | Pedersen et al. | 307/465 |
| 5,260,611 | 11/1993 | Cliff et al. | 307/465 |
| 5,274,581 | 12/1993 | Cliff et al. | 364/784 |
| 5,350,954 | 9/1994 | Patel | 307/465 |
| 5,371,422 | 12/1994 | Patel et al. | 326/41 |
| 5,396,608 | 3/1995 | Garde | 395/400 |
| 5,448,522 * | 9/1995 | Huang | 365/230.05 |
| 5,506,850 | 4/1996 | Osann, Jr. | 371/22.1 |
| 5,541,530 | 7/1996 | Cliff et al. | 326/41 |
| 5,543,732 | 8/1996 | McClintock et al. | 326/41 |
| 5,550,782 | 8/1996 | Cliff et al. | 365/230.05 |
| 5,559,450 | 9/1996 | Ngai et al. | 326/40 |
| 5,566,123 | 10/1996 | Freidin et al. | 365/230.05 |
| 5,592,106 | 1/1997 | Leong et al. | 326/41 |
| 5,614,840 | 3/1997 | McClintock et al. | 326/41 |
| 5,689,195 | 11/1997 | Cliff et al. | 326/41 |
| 5,715,197 | 2/1998 | Nance et al. | 365/189.02 |
| 5,717,901 | 2/1998 | Sung et al. | 395/497.01 |
| 5,933,023 | 8/1999 | Young | 326/40 |
| 6,011,744 | 1/2000 | Sample et al. | 365/230.03 |
| 6,049,487 * | 4/2000 | Plants et al. | 365/230.05 |
| 6,052,327 * | 4/2000 | Reddy et al. | 365/230.05 |

OTHER PUBLICATIONS

S. E. Wahlstrom, "Programmable Logic Arrays—Cheaper by the Millions," Electronics, Dec. 11, 1967, pp. 90–95.

*Recent Developments in Switching Theory*, A. Mukhopadhyay, ed., Academic Press, New York, 1971, chapters VI and IX, pp. 229–254 and 369–422.

El Gamal et al., "An Architecture for Electrically Configurable Gate Arrays," IEEE Journal of Solid–State Circuits, vol. 24, No. 2, Apr. 1989, pp. 394–398.

El–Ayat et al., "A CMOS Electrically Configurable Gate Array," IEEE Journal of Solid–State Circuits, vol. 24, No. 3, Jun. 1989, pp. 752–762.

"XC5000 Logic Cell Array Family, Technical Data, Advance Information," Xilinx, Inc., Feb. 1995.

John L. Nichols, "A Logical Next Step for Read–Only Memories", Electronics, Jun. 12, 1967, pp. 111–113.

Floyd Kvamme, "Standard Read–Only Memories Simplify Complex Logic Design", Electronics, Jan. 5, 1970, pp. 88–95.

Albert Hemel, "Making Small ROM's [sic] Do Math Quickly, Cheaply and Easily", Electronics, May 11, 1970, pp. 104–111.

William I. Fletcher et al., "Simplify Sequential Circuit Designs", Electronics Design, Jul. 8, 1971, pp. 70–72.

Howard A. Sholl et al., "Design of Asynchronous Sequential Networks Using Read–Only Memories", IEEE Transactions on Computers, vol. C–24, No. 2, Feb. 1975, pp. 195–206.

Arnold Weinberger, "High–Speed Programmable Logic Array Adders", IBM J. Res. Develop., vol. 23, No. 2, Mar. 1979, pp. 163–178.

Yahiko Kambayashi, "Logic Design of Programmable Logic Arrays", IEEE Transactions on Computers, vol. C–28, No. 9, Sep. 1979, pp. 609–617.

*The Programmable Logic Data Book*, 1996, Xilinx, Inc., San Jose, CA, pp. 4–5 to 4–20.

* cited by examiner

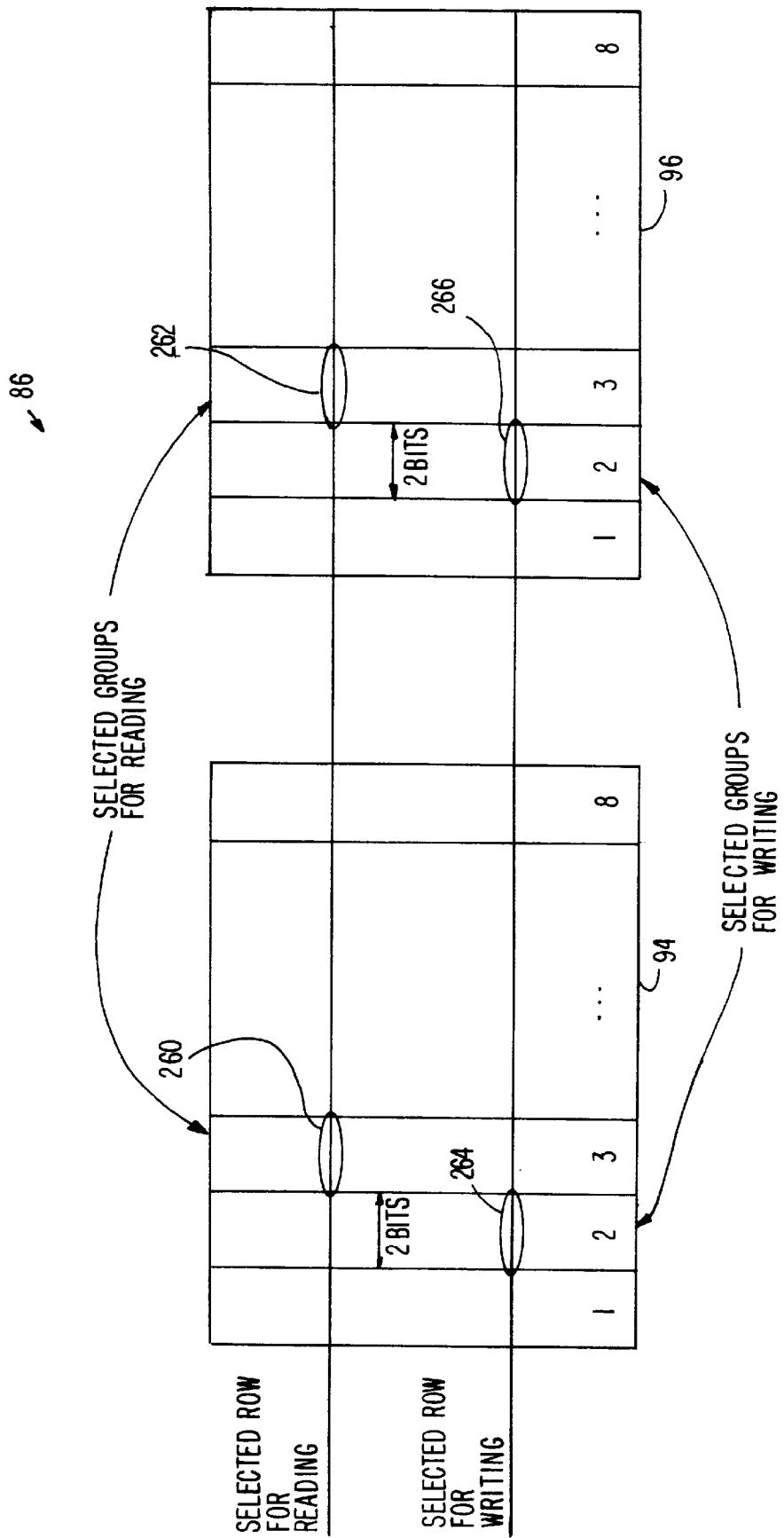

PROGRAMMABLE LOGIC DEVICE MEMORY ARRAY CIRCUIT HAVING COMBINABLE SINGLE-PORT MEMORY ARRAYS

This application is a continuation of application Ser. No. 09/107,926, filed Jun. 30, 1998, which claims the benefit of U.S. provisional application No. 60/061,983, filed Oct. 16, 1997.

BACKGROUND OF THE INVENTION

This invention relates to programmable logic devices. More particularly, this invention relates to programmable logic device memory arrays.

Programmable logic devices are integrated circuits that may be programmed by a user to perform various logic functions. At their most basic level, programmable logic devices contain programmable components, such as erasable programmable read-only memory (EPROM) transistors, electrically erasable programmable read-only memory (EEPROM) transistors, random access memory (RAM) transistors or cells, fuses, and antifuses. Higher-level functions are provided by organizing the programmable components into groups of components. The groups of components are electrically connected to one another by programmable interconnections. Illustrative programmable logic devices are described in Cliff et al. U.S. Pat. No. 5,689,195.

Programmable logic devices such as those described in U.S. Pat. No. 5,689,195 generally have arrays of random-access memory (RAM) for storing data during device operation. The memory arrays, which are sometimes referred to as embedded array blocks (EABs), are made up of rows and columns of memory cells. The word size used to access data in the memory arrays is generally smaller than the physical dimensions of the memory arrays. For example, a two kilobit (2K) memory array might have 64 rows and 32 columns of memory cells for storing data, whereas the device might use eight-bit data words. When it is desired to read or write a data word, the eight data bits are either retrieved from or written to the memory array.

Memory arrays of this type may be provided with a variable depth and width feature that allows the size of the data word that is used to access the memory array (its "width") and the resulting capacity of the array for data storage (its "depth") to be selectively programmed by the user. A typical 2K variable depth and width memory array can be programmed to have the respective depth and width configurations of: 2K×1, 1K×2, 512×4, or 256×8. With such variable depth and width memory arrays, data may be either written to or read from the array in words of the selected width. However, data cannot be written to and read from such conventional arrays simultaneously. This capability is needed for applications in which the memory array is used to implement a first-in-first-out buffer or in other such applications in which the memory array is shared between two concurrent processes, one of which reads data from the array and one of which writes data to the array.

A dual-port programmable logic device memory array arrangement that allows data words to be written and read simultaneously is described in Reddy et al. patent application Ser. No. 09/107,533, filed Jun. 30, 1998. One such dual-port memory array is typically associated with each of the rows of programmable logic regions on a programmable logic device. This arrangement allows the memory array to be used to implement first-in-first-out buffers and other such applications. However, sometimes all or part of a logic design does not need the dual-port capabilities of such memory arrays. Logic resources may be wasted when single-port memory arrays with smaller data width configurations would have sufficed.

It is therefore an object of the present invention to provide a programmable logic device memory array circuit containing a pair of single-port memory arrays that may either be operated individually or combined when a memory array with dual-port capabilities is desired.

SUMMARY OF THE INVENTION

This and other objects of the invention are accomplished in accordance with the principles of the present invention by providing a programmable logic device memory array circuit formed from a pair of combinable single-port memory arrays. A typical programmable logic device in which such a memory array circuit may be used has a number of regions of programmable logic organized in intersecting rows and columns. One of the programmable logic device memory array circuits may be associated with each row of such logic regions. The rows and columns of logic regions and memory array circuits may be interconnected with associated groups of horizontal and vertical interconnects. The combinable single-port memory arrays are preferably memory arrays having a user-programmable depth and width.

The memory array circuit may be operated either as two individual single-port memory arrays or as a single dual-port memory array. When operated individually, data may be written to each single-port memory array or read from that single-port memory array, but data may not be written to and read from the memory array concurrently. When operated as a single dual-port memory array, data may be written to the array at the same time that data is being read from the array. This ability to handle concurrent reading and writing operations in dual-port mode allows the user to implement logic circuit designs with the memory array circuit that would otherwise not be possible. Because the combinable single-port memory arrays may be used individually, logic resources are not wasted when the dual-port function of the memory array circuit is not needed.

Further features of the invention, its nature and various advantages will be more apparent from the accompanying drawings and the following detailed description of the preferred embodiments.

BRIEF DESCRIPTION OF THE DRAWINGS

FIG. 8 is a diagram that illustrates the concurrent memory addressing in dual-port mode using the variable depth and width memory array configuration of FIG. 6 in accordance with the present invention.

DETAILED DESCRIPTION OF THE PREFERRED EMBODIMENTS

Figure 1:
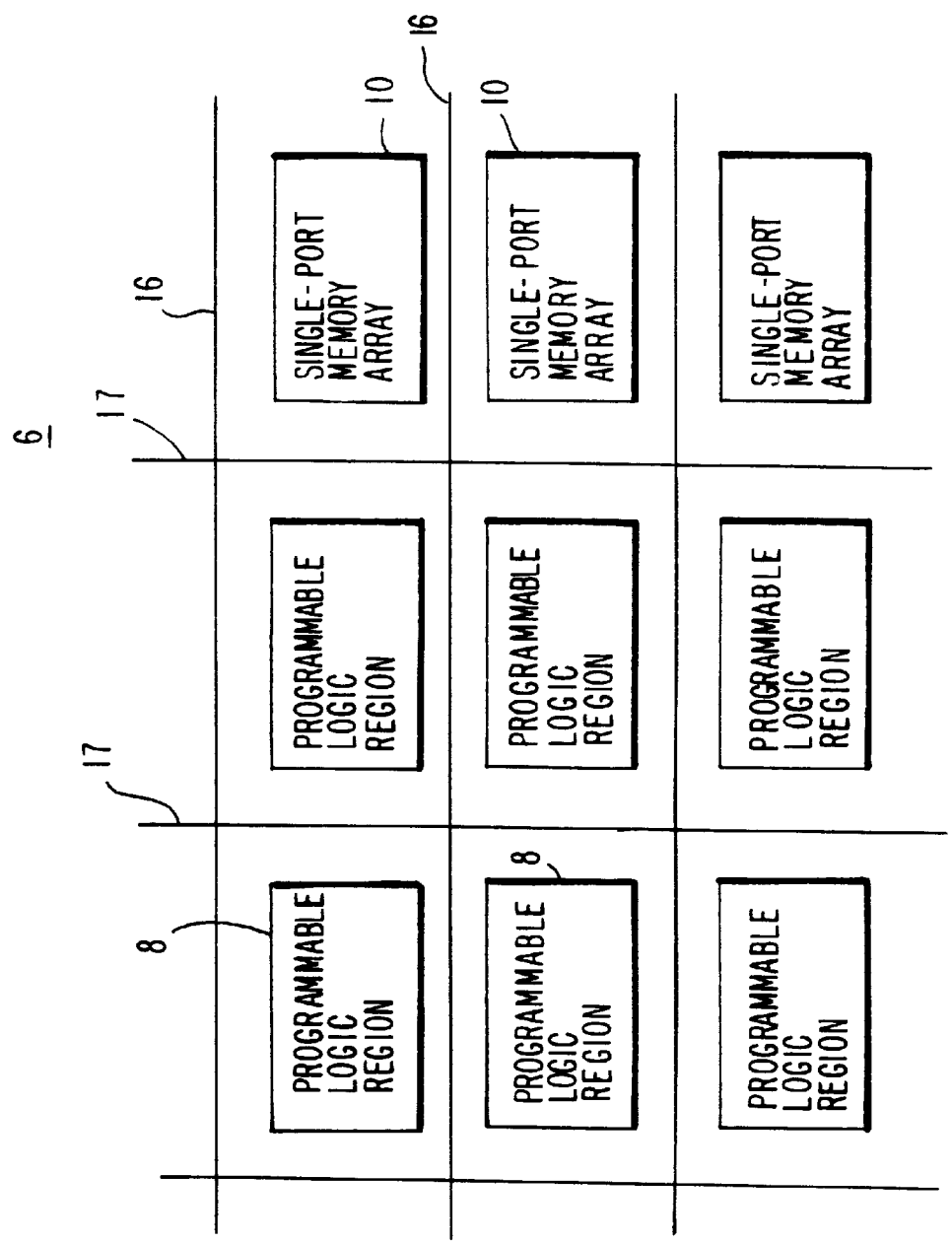
FIG. 1 is a diagram of a conventional programmable logic device that uses single-port variable depth and width memory arrays.

Programmable logic array integrated circuit devices are described in Cliff et al. U.S. Pat. No. 5,689,195, which is hereby incorporated by reference herein. A typical programmable logic device 6 has programmable logic regions 8 arranged in a two-dimensional array of intersecting rows and columns, as shown in FIG. 1. Each programmable logic region 8 may include a number of subregions of programmable logic. Such subregions are typically based on product-term logic or look-up table logic and may include register logic for registering logic signals. The rows and columns of device 6 typically have associated groups of global interconnects 16 and 17 for conveying signals between various logic regions 8.

Some programmable logic devices 6 contain single-port memory arrays 10 with a variable depth and width. In such devices, the size of the data word that is used to access each single-port memory array 10 (its "width") and the resulting capacity of the array 10 for data storage (its "depth") may be selectively programmed by the user. A typical 2K variable depth and width memory array can be programmed to have the respective depth and width configurations of: 2K×1 (x1 mode), 1K×2 (x2 mode), 512×4 (x4 mode), or 256×8 (x8 mode). Programmable logic devices 6 that contain single-port variable depth and width memory arrays 10 generally contain one such array in each row.

Figure 2:
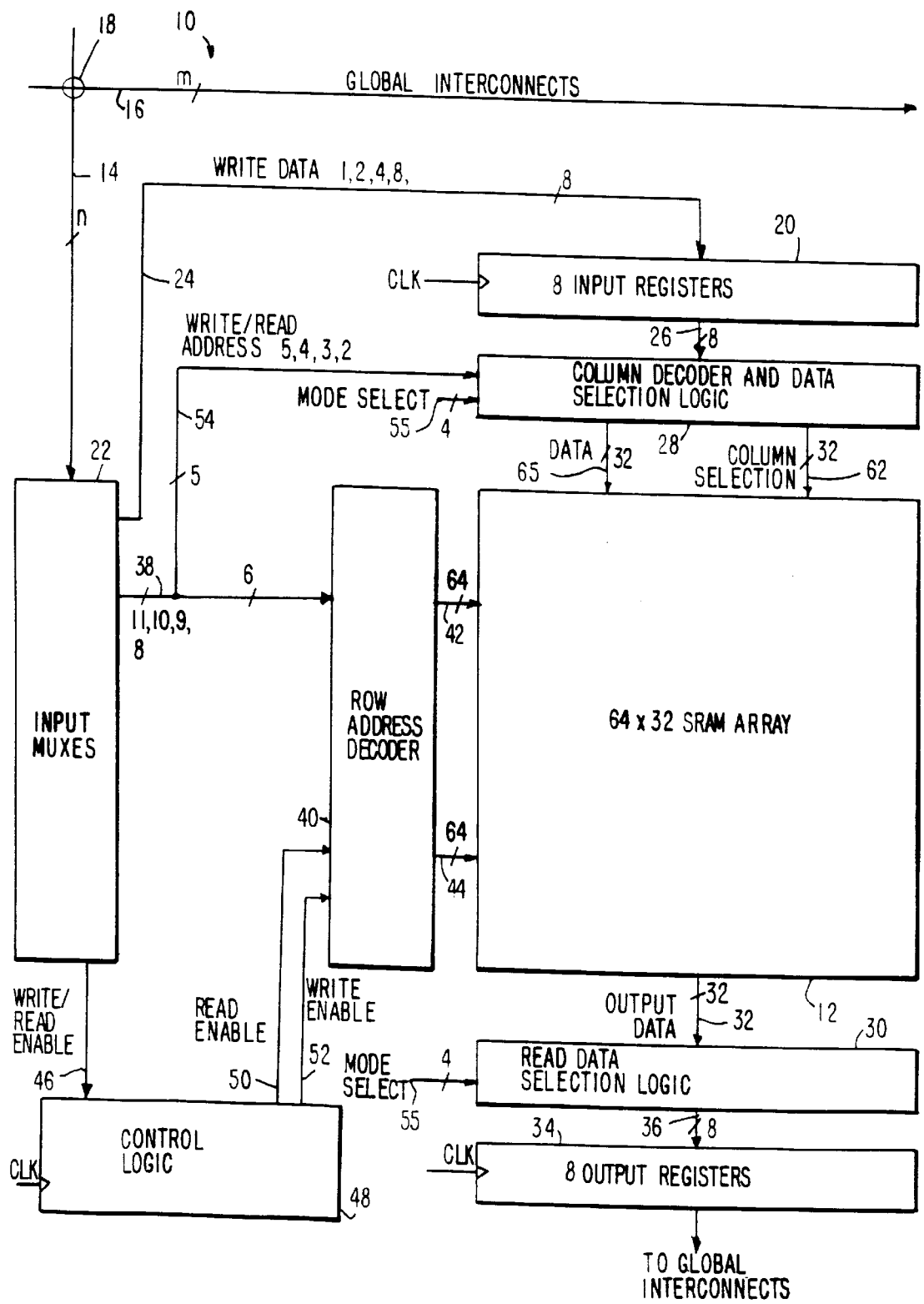
FIG. 2 is a diagram of a conventional single-port variable depth and width memory array.

A typical single-port variable depth and width memory array 10 is shown in FIG. 2. Programmable logic device data is stored in 64 rows and 32 columns of static random-access memory (SRAM) cells in SRAM memory array 12.

Data signals to be written into memory array 12 are supplied on input path 14. The data signals may be routed to array 12 from global interconnects such as global horizontal interconnects 16 using multiplexer circuitry 18. The data signals are distributed to 8 input registers 20 via programmable input multiplexers 22 and write data path 24. The number of data lines in path 24 that are used depends on the selected mode for array 12. One data line is used in the x1 mode, two data lines are used in the x2 mode, four data lines are used in the x4 mode, and eight data lines are used in the x8 mode. The number of data output lines 26 from input registers 20 that are used is the same as the number of data lines used in path 24 to provide data to input registers 20. Data from input registers 20 may be written into a desired location in memory array 12 using column decoder and data selection logic 28.

Data signals to be read from memory array 12 are supplied to read data selection logic 30 via data output lines 32. Read data selection logic 30 provides the data signals to eight output registers 34 via path 36. Registered data from output registers 34 may be routed to the global interconnects.

In order to address a location in memory array 12 for reading or writing, address signals are supplied to address path 38 via input path 14 and input multiplexers 22. Six of the address signals supplied to address path 38 are used by row address decoder 40 to activate either an appropriate one of 64 read word lines 42 or an appropriate one of 64 write word lines 44.

If it is desired to perform a read operation, a suitable write/read enable signal is supplied via input path 14 and routed to write/read enable 46 by input multiplexers 22. Taking write/read enable 46 low causes control logic 48 to simultaneously take read enable 50 high and write enable 52 low. The read word line 42 that is specified by the address supplied to row address decoder 40 is thus taken high.

If it is desired to perform a write operation, a suitable write/read enable signal is supplied via input path 14 and routed to write/read enable 46 by input multiplexers 22. Taking write/read enable 46 high causes control logic 48 to simultaneously take read enable 50 low and write enable 52 high. The write word line 44 that is specified by the address supplied to row address decoder 40 is thus taken high.

During either reading or writing, the remaining bits of the address supplied on address path 38 are provided to column decoder and data selection logic 28 as a column write/read address via path 54. The column write/read address specifies the location of the columns in array 12 into which data is to be written or from which data is to be read. The number of bits of write/read address information supplied to column decoder and data selection logic 28 depends on the size of the data word in array 12 that is being addressed. For example, five bits of column write/read address information are required when it is desired to specify a particular one of the 32 columns in array 12 into which to write or from which to read a desired one-bit wide data word. Mode select signals are supplied at terminals 55 to configure multiplexer circuitry within column decoder and data selection logic 28 and within read data selection logic 30 so that these components perform the appropriate routing functions needed for the desired mode of operation (i.e., x1, x2, x4, or x8 mode).

Figure 3:
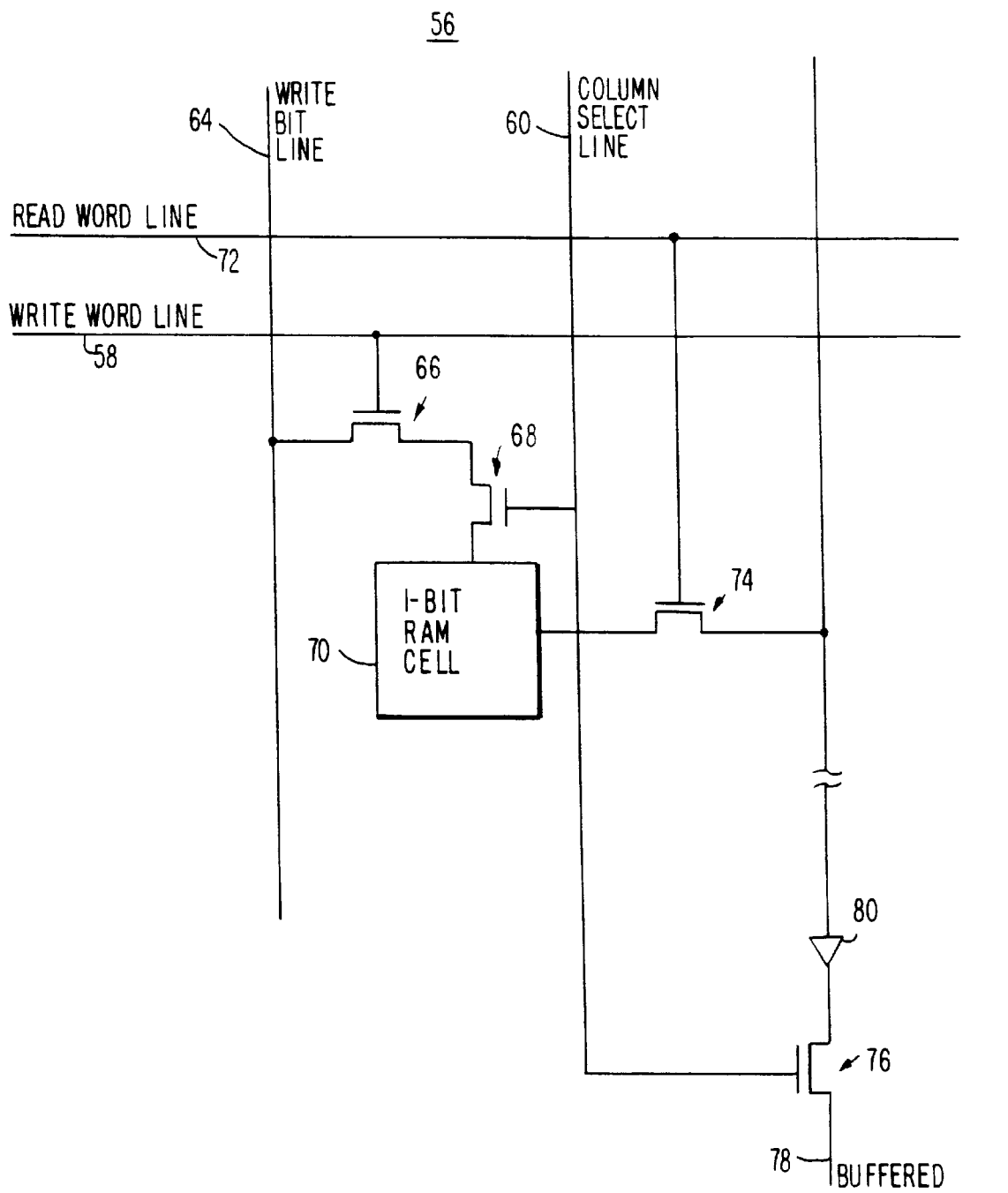
FIG. 3 is a diagram of a conventional memory array cell for use in a single-port variable depth and width memory array.

A typical data storage cell arrangement for a cell 56 in array 12 is shown in FIG. 3. Data may be written into cell 56 by taking write word line 58 (one of write word lines 44 in FIG. 2) high with row address decoder 40 and taking column select line 60 (one of column select lines 62 in FIG. 2) high with column decoder and data selection logic 28 while supplying data to cell 56 via write bit line 64 (one of write bit lines 65 in FIG. 2). This turns on transistors 66 and 68 and causes the data on write bit line 64 to flow into one-bit random access memory (RAM) cell 70.

Data may be read from cell 56 by taking read word line 72 (one of read word lines 42 in FIG. 2) high with row address decoder 40 while taking column select line 60 high with column decoder and data selection logic 28. This turns on transistors 74 and 76 so that data may pass from RAM cell 70 to buffered read bit line 78 (one of data output lines 32 in FIG. 2) via buffer 80.

The variable depth and width memory array arrangement of FIG. 2 allows data to be accessed in various word sizes. Regardless of the word size being accessed, at most a single row in array 12 may be selected at a time. Either a read word line may be taken high for a read operation or a write word line may be taken high for a write operation.

One, two, four, or eight of the columns of memory cells 56 in array 12 may be selected at a time, depending on whether memory array 10 is in the x1, x2, x4, or x8 mode. In the x1 mode, five bits of write/read address information from address path 38 are used to select a single column from the 32 columns of array 12. In the x2 mode, four bits of write/read address information are used to specify the two columns which are to be accessed. In the x4 mode, three bits of write/read address information are used to specify the group of four columns of array 12 to be accessed. In the x8 mode, two bits of write/read address information are used to specify the group of eight columns of array 12 to be accessed.

Accessing a given column of memory cells 56 involves taking the column select line 62 of FIG. 2 for that column high while providing the data for the column from input registers 20 to the appropriate write bit line 65 of FIG. 2 for the column using column decoder and data selection logic 28. The columns that are accessed when a group of more than one column of cells 56 is accessed at a time (e.g., when four columns are accessed in the x4 mode) are typically adjacent.

Figure 4:
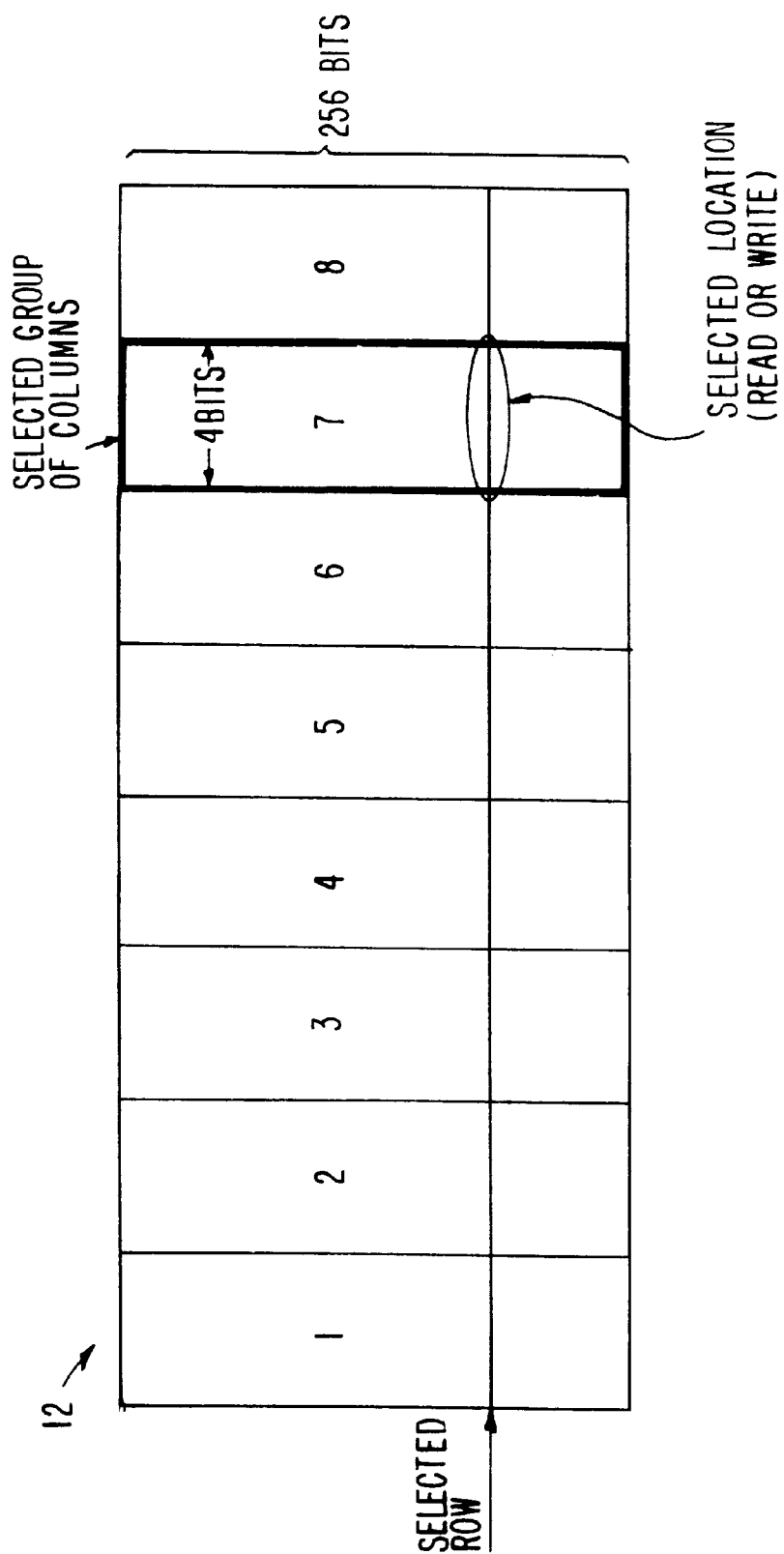
FIG. 4 is a diagram that illustrates the addressing of a elected memory location in a conventional single-port variable depth and width memory array.

This type of arrangement is illustrated in FIG. 4, in which memory array 12 is shown being accessed in the x4 mode. In the x4 mode, array 12 may be thought of as being partitioned into eight four-column groups of columns each of which has a capacity of 256 bits (see, e.g., group 3). The total capacity of each four-column group of columns is 256 bits, because there are 64 bits per column. Because there are eight groups and each group has 64 four-bit words, there are a total of 512 four-bit words in array 12, which allows array 12 to operate in the 512×4 configuration in the x4 mode. The location of a desired four-bit data word can be specified by selecting one of these groups of columns using four of the column select lines 62. For example, column decoder and data selection logic 28 of FIG. 2 may be used to select the columns of memory cells in group 7 of FIG. 4 by taking the four column select lines 62 (FIG. 2) that are associated with group 7 high.

In the x1 mode, array 12 can be partitioned into 32 groups of columns each of which is one bit wide. In the x2 mode, array 12 can be partitioned into 16 groups of columns each of which is two bits wide. In the x8 mode, array 12 can be partitioned into four groups, each of which is eight bits wide.

In the conventional variable depth and width memory array arrangement of FIG. 4, data may be either written to the selected location or may be read from the selected location, but not both at the same time. Data may be written to the selected location in the array by selecting the desired row using a write word line and by providing data to the cells in the selected columns using the appropriate write bit lines. Data may be read from the selected location by selecting the desired row using a read word line and by routing data from the array using buffered read bit lines. However, it is not possible to write data into array 12 at one selected location while simultaneously reading data from another selected location. The ability to perform such simultaneous reading and writing operations with the memory array is necessary if the memory array is to be used to implement a first-in-first-out buffer or other such memory arrangement.

A dual-port programmable logic device memory array that allows data words to be written and read simultaneously is described in Reddy et al. patent application Ser. No. 09/107,533, filed Jun. 30, 1998. The dual-port memory array described in the Reddy et al. patent application supports data widths of up to sixteen bits. Although this arrangement is desirable for handling concurrent writing and reading tasks involving sixteen bit data, the full sixteen-bit data width and the dual-port capability of such arrays are not always needed. For example, it may only be necessary to handle eight-bit data and the ability to perform concurrent read and write operations may not be required. To handle two eight-bit data width tasks, it would be preferable to have two eight-bit memory arrays available rather than a single sixteen-bit memory array.

In accordance with the present invention, a programmable logic device is provided having a number of paired single-port memory arrays. Each pair of single-port memory arrays may be combined by a user into a dual-port memory array having twice the data width handling capacity of the individual single-port memory arrays. When single-port memory arrays having smaller data widths suffice, the single-port memory arrays may be used separately, thereby effectively doubling the number of memory arrays available on the programmable logic device to implement desired logic functions. In a preferred embodiment, the memory arrays have a user-selectable variable depth and width, although memory arrays of a fixed depth and width may be used if desired.

Figure 5:
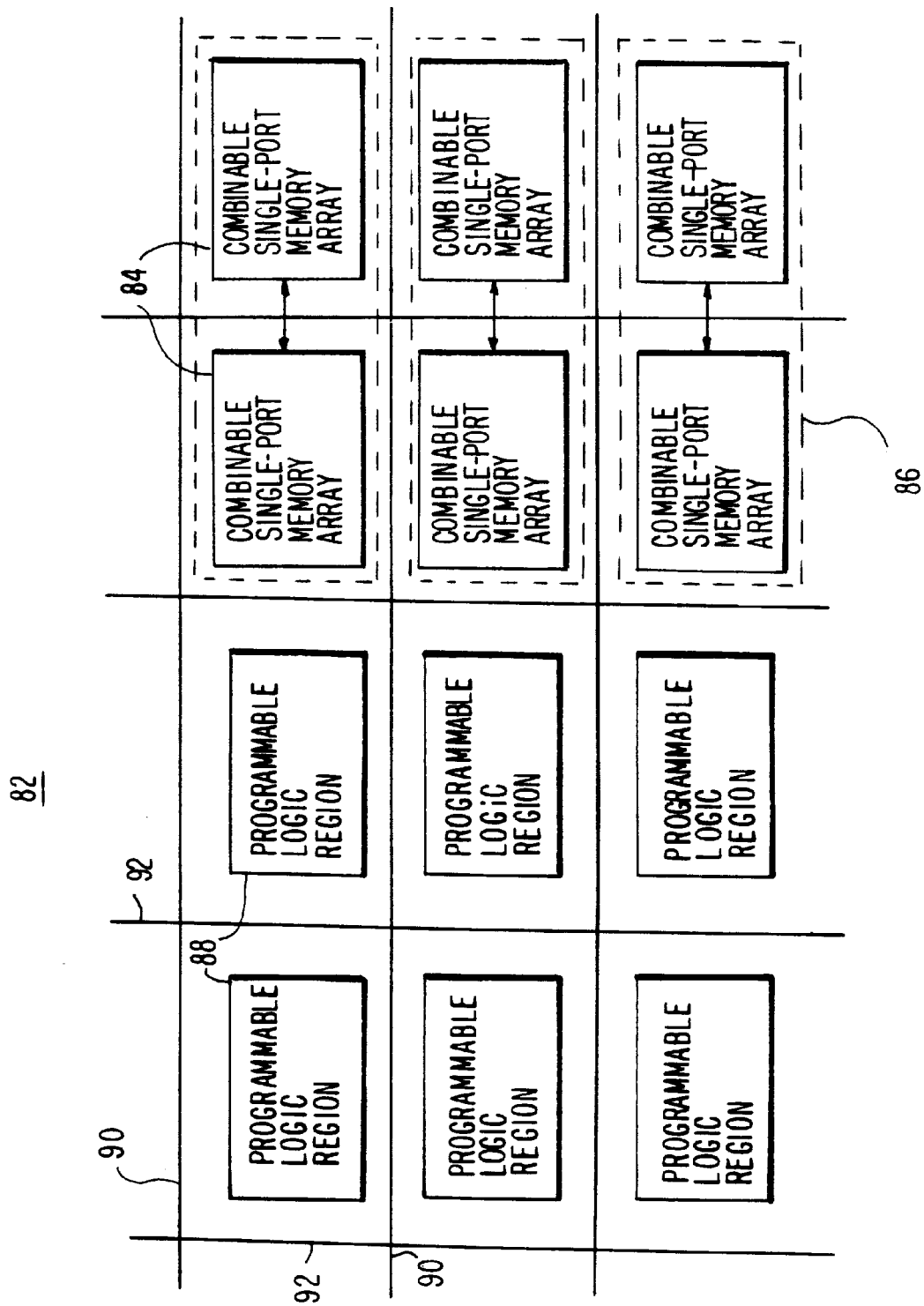
FIG. 5 is a diagram of a programmable logic device containing pairs of single-port memory arrays that may be configured as dual-port memory arrays in accordance with the present invention.

A programmable logic device 82 that contains a number of user-combinable single-port variable depth and width memory arrays 84 is shown in FIG. 5. Each pair of single-port memory arrays 84 may be combined by a user to form a dual-port memory array 86.

In some situations, it may be desirable to use single-port memory arrays 84 independently. For example, a user may wish to implement a logic design that does not require the simultaneous read and write capability of a dual-port memory array, but that requires the use of more than one memory array. In such an arrangement, it is preferable to have relatively many of the narrower single-port memory arrays 84 available rather than relatively fewer of the wider dual-port memory arrays 86.

In other situations, it may be desirable to use pairs of single-port memory arrays 84 combined into dual-port memory arrays 86. For example, the user may wish to implement a logic design that requires handling data in wide widths. Dual-port memory arrays 86 have twice the data width handling capacity of single-port memory arrays 84. The user may also require the ability to perform simultaneous read and write operations. Dual-port memory arrays 86 support concurrent read and write operations.

Programmable logic device 82 preferably contains a number of programmable logic regions 88. Programmable logic regions 88 may be programmed by a user to perform various logic functions. A programmable logic device containing one type of suitable programmable logic regions is described in the above-mentioned Cliff et al. U.S. Pat. No. 5,689,195. If desired, other types of suitable programmable logic regions may be used in programmable logic device 82.

In the arrangement shown in FIG. 5, combinable single-port memory arrays 84 and programmable logic regions 88 are arranged in intersecting rows and column. This arrangement is illustrative. If desired, any other suitable type of programmable logic device arrangement may be used.

Each programmable logic region 88 may contain a number of subregions of programmable logic. Such subregions may be based on product-term logic or look-up table logic and may include register logic for registering logic signals. The rows and columns of programmable logic regions 88 may be interconnected by associated groups of interconnects such as global horizontal interconnects 90 and global vertical interconnects 92. Global interconnects such as interconnects 90 and 92 generally span substantially the entire programmable logic device 82 without interruption, but may also contain half-length interconnects, quarter-length interconnects, eighth-length interconnects or other suitable fractional-length interconnects if desired.

The connections between programmable logic regions 88 and interconnects 90 and 92 and the connections between memory arrays 84 and interconnects 90 and 92 are not shown in FIG. 5 to avoid over-complicating the drawing. Such connections may be made by suitable input and output multiplexing and driver circuitry. Circuitry may also be provided to form pathways between horizontal interconnects 90 and vertical interconnects 92. Suitable connections between logic regions and their associated interconnects are described in the above-mentioned U.S. Pat. No. 5,689,195.

In single-port variable depth and width memory arrays 84, the size of the data word that is used to access each memory array 84 (its "width") and the resulting capacity of the array for data storage (its "depth") may be selectively programmed by the user. In one suitable arrangement, each memory array 84 has a 1 K capacity that can be programmed to have the respective depth and width configurations of: 1K×1 (x1 mode), 512×2 (x2 mode), 256×4 (x4 mode), and 128×8 (x8 mode). Programmable logic device 82 preferably contains a pair of user-configurable single-port variable depth and width memory arrays 84 in each row. Each pair may preferably be combined into a single 128×16 dual-port memory array 86, as shown in FIG. 5, although other suitable configurations may be used if desired.

Figure 6:
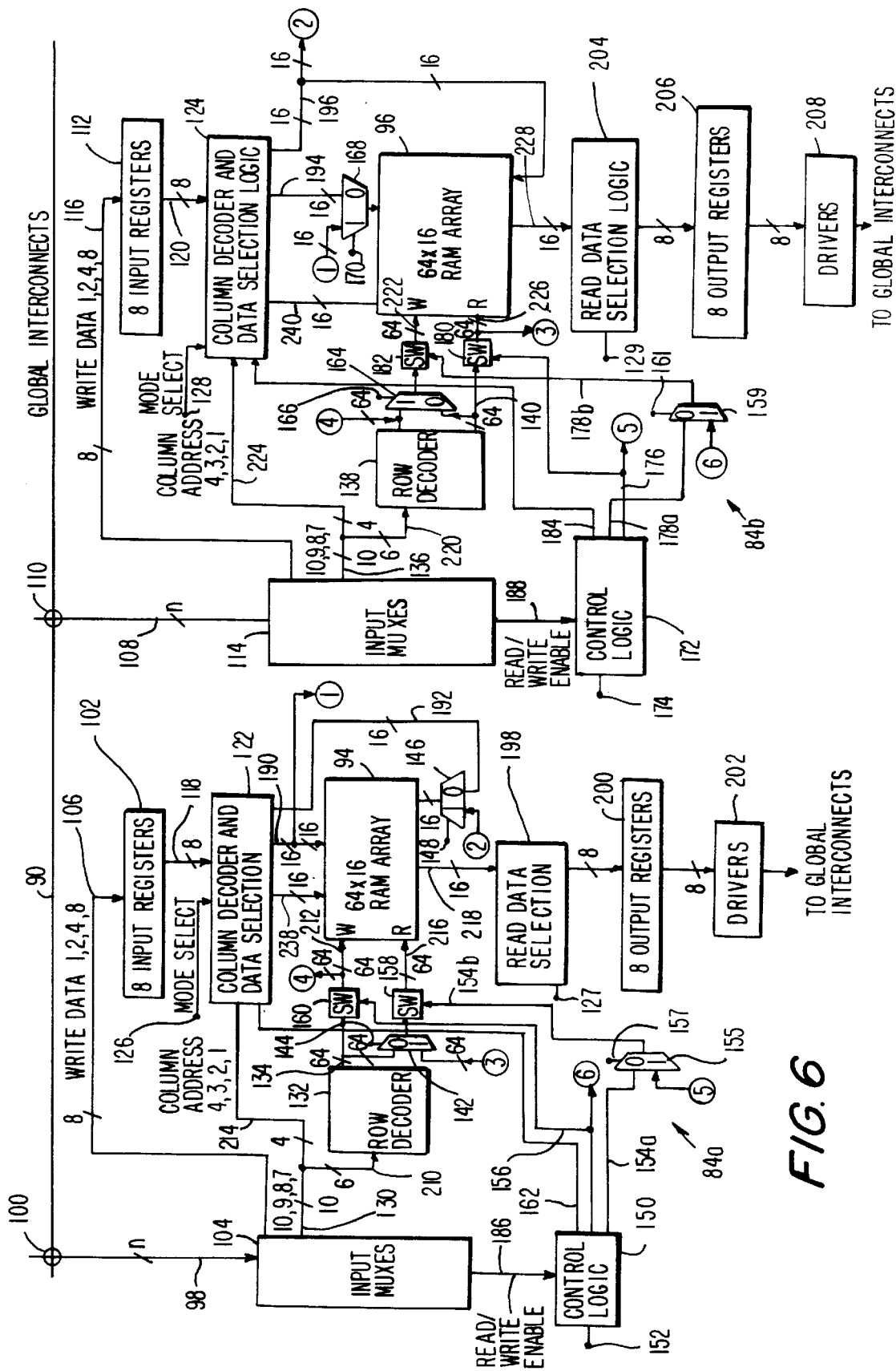
FIG. 6 is a diagram of two single-port variable depth and width memory arrays that may be combined to form a dual-port variable depth and width memory array in accordance with the present invention.

An illustrative arrangement for a pair of single-port variable depth and width memory arrays 84 is shown in FIG. 6. Programmable logic device data may be stored in 64 rows and 16 columns of random-access memory (RAM) cells in each of memory arrays 94 and 96. Memory arrays 94 and 96 are preferably static random-access memory (SRAM) arrays. Memory array 94 stores data for user-combinable single-port variable depth and width memory array 84a. Memory array 96 stores data for user-combinable single-port variable depth and width memory array 84b.

Data signals to be written into memory array 94 are supplied on input path 98. Data signals may be routed to input path 98 from global interconnects such as global horizontal interconnects 90 using programmable multiplexer circuitry 100. The data signals from path 98 are distributed to eight input registers 102 via programmable input multiplexers 104 and write data path 106.

Data signals to be written into memory array 96 are supplied on input path 108. Data signals may be routed to input path 108 from global interconnects such as global horizontal interconnects 90 using programmable multiplexer circuitry 110. The data signals from path 108 are distributed to eight input registers 112 via programmable input multiplexers 114 and write data path 116.

When memory array 84a is in single-port mode, data may be either written to array 94 or read from array 94, but may not be both written to and read from array 94 concurrently. Similarly, when memory array 84b is in single-port mode, data may be either written to array 96 or read from array 96, but may not be both written to and read from array 96 concurrently.

In dual-port mode, the resources of memory array 84a and memory array 84b are combined to form a single dual-port variable depth and width memory array. The dual-port memory array has a 2K capacity—1K of storage from memory array 94 and 1K of storage from memory array 96.

The number of data lines in write paths 106 and 116 that are actively used at a given time depends on the selected mode (i.e., x1, x2, x4, or x8) for arrays 84a and 84b. One data line is in active use per array in the x1 mode (i.e., when data is processed in a one-bit width), two data lines are used in the x2 mode, four data lines are used in the x4 mode, and eight data lines are used in the x8 mode. All 16 data lines are used when arrays 84a and 84b are used in combination as a sixteen bit dual-port memory array. The number of data output lines 118 and 120 from input registers 102 and 112 that are used is the same as the number of data lines actively used in paths 106 and 116 to provide data to input registers 102 and 112, respectively. In dual-port mode, the effective width of the combined single-port arrays is twice the width of each single-port array taken separately. Thus, when each single-port array operates in a x1 mode, the effective dual-port width is x2, etc.

During single-port write operations, data from input registers 102 may be written into desired locations in memory array 94 using column decoder and data selection logic 122 and row decoder 132. Similarly, data from input registers 112 may be written into desired locations in memory array 96 using column decoder and data selection logic 124 and row decoder 138.

The circuitry of column decoder and data selection logic 122 and 124 is used to select column locations to which data is to be written in memory arrays 94 and 96 and to route data signals from input registers 102 and 112 to those respective locations during single-port write operations. If desired, column decoder and data selection logic 122 and 124 may use basically the same type of arrangement used in the column decoder and data selection logic circuits of standard variable depth and width programmable logic device memory arrays. As with such standard column decoder and data selection logic arrangements, patterns of fixed connections and multiplexer circuitry within column decoder and data selection logic 122 and 124 may be used to selectively route signals to their proper destinations based on the modes of arrays 84a and 84b (i.e., x1, x2, x4, or x8 mode). The circuitry of column decoder and data selection logic 122 and 124 may be configured by supplying suitable mode selection signals to terminals 126 and 128.

In order to address locations in memory array 94 for reading or writing, address signals are supplied to address path 130 via input path 98 and input multiplexer 104. Six of the address signals supplied to address path 130 are used as a row address by row decoder 132 to activate an appropriate one of 64 decoded row lines 134 for array 84a. Similarly, address signals are supplied to address path 136 via input path 108 and input multiplexer 114. Six of the address signals supplied to address path 136 are used as a row address by row decoder 138 to activate an appropriate one of 64 decoded row lines 140 for array 84b.

When memory arrays 84a and 84b are placed in single-port mode they function as separate single-port variable depth and width memory arrays. When memory arrays 84a and 84b are placed in dual-port mode they function together as a dual-port variable depth and width memory array. The user may place memory arrays 84a and 84b in either single-port or dual-port mode using configuration bits (i.e., programmable memory bits on programmable logic device 82 that are programmed by the user when device 82 is configured). Any suitable type of memory may be used for such configuration bits.

In memory array 84a, the outputs of the single-port/dual-port configuration bits are applied to multiplexer 142 (at terminal 144), multiplexer 146 (at terminal 148), and control logic 150 (at terminal 152). Control logic 150 generates corresponding control signals on lines 154a and 156 to control switches 158 (via multiplexer 155 and line 154b) and 160. Multiplexer 155 is controlled by a suitable configuration bit applied at terminal 157 that indicates whether dual-port mode or single-port mode has been selected. Control logic 150 also generates corresponding control signals on line 162 to control column decoder and data selection logic 122. In memory array 84b, the outputs of the single-port/dual-port configuration bits are applied to multiplexer 164 (at terminal 166), multiplexer 168 (at terminal 170), and control logic 172 (at terminal 174). Control logic 172 generates corresponding control signals on lines 176 and 178a to control switches 180 and 182 (via multiplexer 159 and line 178b). Multiplexer 159 is controlled by a suitable configuration bit applied at terminal 161 that indicates whether dual-port mode or single-port mode has been selected. Control logic 172 also generates corresponding control signals on line 184 to control column decoder and data selection logic 124.

In single-port mode, multiplexers 142, 146, 164, and 168 connect their "0" inputs to their respective outputs. In dual-port mode, multiplexers 142, 146, 164, and 168 connect their "1" inputs to their respective outputs.

When arrays 84a and 84b are in single-port mode, the user supplies read/write enable signals on read/write enable lines 186 and 188 that cause control logic 150 and 172 to place column decoder and data selection logic 122 and 124 in either write mode or read mode. Signals from control logic 150 that direct column decoder and data selection logic 122 whether to perform write operations or read operations when array 84a is in single-port mode are provided via line 162. During write operations, column decoder and data selection logic 122 generates write column select signals on write column select lines 190. During read operations, column decoder and data selection logic 122 generates read column select signals on read column select lines 192. Column select lines 190 and 192 convey the same column select signals when accessing a given memory location in the single-port mode of operation. Signals from control logic 172 that direct column decoder and data selection logic 124 whether to perform write operations or read operations when array 84b is in single-port mode are provided via line 184. During write operations, column decoder and data selection logic 124 generates write column select signals on write column select lines 194. During read operations, column decoder and data selection logic 124 generates read column select signals on read column select lines 196. Column select lines 194 and 196 convey the same column select signals when accessing a given memory location in the single-port mode of operation.

In single-port mode, the signals on read/write enable line 186 determine whether array 84a is performing a read or a write operation. Data is written to array 94 via input registers 102 and column decoder and data selection logic 122. Data is read from array 94 using read data selection logic 198, output registers 200, and drivers 202. Read data selection logic 198 preferably contains multiplexing circuitry responsive to mode select signals applied to terminal 127. The mode select signals applied to terminal 127 should be the same as the mode select signals applied to terminal 126. The multiplexing circuitry in read data selection logic 198 may be used in conjunction with column decoder and data selection logic 122 to route data from the appropriate columns of array 94 to registers 200. Drivers 202 may be connected to global interconnects such as horizontal global interconnects 90 or vertical interconnects 92.

Similarly, the signals on read/write enable line 188 in single-port mode determine whether array 84b is performing a read or a write operation. Data is written to array 96 via input registers 112 and column decoder and data selection logic 124. Data is read from array 96 using read data selection logic 204, output registers 206, and drivers 208. Read data selection logic 204 contains multiplexing circuitry responsive to mode select signals applied to terminal 129. The mode select signals applied to terminal 129 should be the same as the mode select signals applied to terminal 128. The multiplexing circuitry in read data selection logic 204 may be used in conjunction with column decoder and data selection logic 124 to route data from the appropriate columns of array 96 to registers 206. Drivers 208 may be connected to global interconnects such as horizontal global interconnects 90 or vertical interconnects 92. In single-port mode, data may not be read from array 94 at the same time that data is being written to array 94 and data may riot be read from array 96 at the same time that data is being written to array 96.

During either reading or writing operations when array 84a is in the single-port mode, row decoder 132 activates a selected one of its 64 row output lines 134 in response to the six-bit row address provided at input 210.

When a write operation is being performed for array 84a in single-port mode, control logic 150 turns off switch 158 using control signals on line 154a that are applied to switch 158 via multiplexer 155 and line 154b and turns on switch 160 using control signals on line 156. This allows the active row output line 134 from row decoder 132 to pass to array 94 as a corresponding one of write word lines 212. Column decoder and data selection logic 122 takes a selected group of write column select lines 190 high based on the column address on address line 214. The write column select lines 190 that are activated determine which columns of array 94 are to receive data. Data to be written is supplied on write data path 106. The number of bits of data that are written to array 94 during the write operation (i.e., 1 bit, 2 bits, 4 bits, or 8 bits) depends on the selected mode of array 84a (x1 mode, x2 mode, x4 mode, or x8 mode), which is controlled by the mode selection signals supplied at mode select terminal 126. The number of bits of address information that are supplied on address line 214 depends on the selected mode of array 84a. Four bits of column address information are used in the x1 mode, three bits in the x2 mode, two bits in the x4 mode, and one bit in the x8 mode.

When a read operation is being performed for array 84a in single-port mode, control logic 150 turns on switch 158 using control signals on line 154a that are applied to switch 158 via multiplexer 155 and line 154b and turns off switch 160 using control signals on line 156. This allows the active row output line 134 from row decoder 132 to pass to array 94 as a corresponding one of read word lines 216. Column decoder and data selection logic 122 takes a number of selected groups of read column select lines 192 high based on the column address on address line 214. The read column select lines 192 that are activated in conjunction with the multiplexing circuitry used in read data selection logic 198 determine which columns of array 94 data is to be read from. Data from array 94 is supplied to read data selection logic 198 on lines 218. The number of bits of data that are read from array 94 during the read operation (i.e., 1 bit, 2 bits, 4 bits, or 8 bits) depends on the selected mode of array 84a (x1 mode, x2 mode, x4 mode, or x8 mode), which is controlled by the mode selection signals supplied at mode select terminals 126 and 127. The number of bits of address information that are supplied on address line 214 depends on the selected mode of array 84a. Four bits of column address information are used in the x1 mode, three bits in the x2 mode, two bits in the x4 mode, and one bit in the x8 mode.

During either reading or writing operations when array 84b is in the single-port mode, row decoder 138 activates a selected one of its 64 row output lines 139 in response to the six-bit row address provided at input 220.

When a write operation is being performed for array 84b in single-port mode, control logic 172 turns off switch 180 using control signals on line 176 and turns on switch 182 using control signals on line 178a that are applied to switch 182 via multiplexer 159 and line 178b. This allows the active row output line 139 from row decoder 138 to pass to array 96 as a corresponding one of write word lines 222. Column decoder and data selection logic 124 takes a selected group of write column select lines 194 high based on the column address on address line 224. The write column select lines 194 that are activated determine which columns of array 96 are to receive data. Data to be written is supplied on write data path 116. The number of bits of data that are written to array 96 during the write operation (i.e., 1 bit, 2 bits, 4 bits, or 8 bits) depends on the selected mode of array 84b (x1 mode, x2 mode, x4 mode, or x8 mode), which is controlled by the mode selection signals supplied at mode select terminal 128. The number of bits of address information that are supplied on address line 224 depends on the selected mode of array 84b. Four bits of column address information are used in the x1 mode, three bits in the x2 mode, two bits in the x4 mode, and one bit in the x8 mode.

When a read operation is being performed for array 84b in single-port mode, control logic 172 turns on switch 180 using control signals on line 176 and turns off switch 182 using control signals on line 178a that are applied to switch 182 via multiplexer 159 and line 178b. This allows the active row output line 140 from row decoder 138 to pass to array 96 as a corresponding one of read word lines 226. Column decoder and data selection logic 124 takes a number of selected groups of read column select lines 196 high based on the column address on address line 224. The read column select lines 196 that are activated in conjunction with the multiplexing circuitry used in read data selection logic 198 determine the columns of array 96 from which data is to be read. Data from array 96 is supplied to read data selection logic 204 on lines 228. The number of bits of data that are read from array 96 during the read operation (i.e., 1 bit, 2 bits, 4 bits, or 8 bits) depends on the selected mode of array 84b (x1 mode, x2 mode, x4 mode, or x8 mode), which is controlled by the mode selection signals supplied at mode select terminals 128 and 129. The number of bits of address information that are supplied on address line 224 depends on the selected mode of array 84b. Four bits of column address information are used in the x1 mode, three bits in the x2 mode, two bits in the x4 mode, and one bit in the x8 mode.

The circuitry of column decoder and data selection logic 122 and 124 and read data selection logic 198 and 204 that is used in selecting memory locations to which data is to be written and from which data is to be read may use basically the same type of arrangement used in the column decoder and data selection logic and read data selection logic circuits of standard single-port variable depth and width programmable logic device memory arrays. As with such standard column decoder and data selection logic and read data selection logic arrangements, patterns of fixed connections and multiplexer circuitry may be used within column decoder and data selection logic 122, column decoder and data selection logic 124, read data selection logic 198, and read data selection logic 204 to selectively route signals to their proper destinations based on the selected modes of arrays 84a and 84b (i.e., x1, x2, x4, or x8 mode).

Figure 7A:
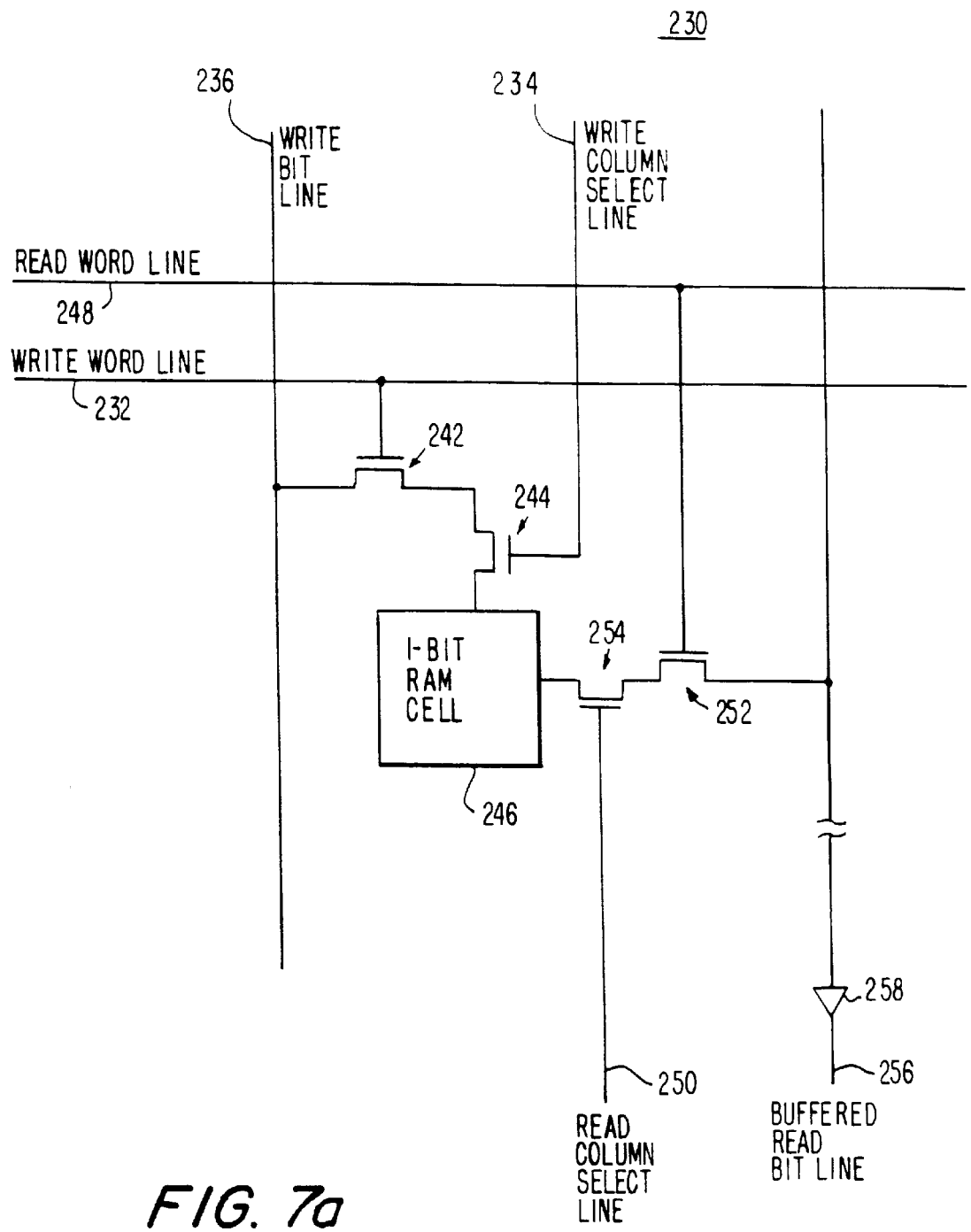
FIG. 7a is a diagram of an illustrative memory array cell for use in the memory arrays of FIG. 6 in accordance with the present invention.

A typical data storage cell arrangement for a cell 230 in either array 94 or array 96 is shown in FIG. 7a. Data may be written into cell 230 by taking write word line 232 (which may be one of write word lines 212 or 222 in FIG. 6) high with either row decoder 132 or 138 of FIG. 6 as appropriate and by taking write column selection line 234 (one of write column selection lines 190 or 194 in FIG. 6) high with either column decoder and data selection logic 122 or 124 of FIG. 6 as appropriate, while supplying data to cell 230 via write bit line 236 (one of write bit lines 238 or 240 in FIG. 6) using column decoder and data selection logic 122 or 124 of FIG. 6 as appropriate. This turns on transistors 242 and 244 and causes the data on write bit line 236 to flow into one-bit random access memory (RAM) cell 246.

Data may be read from cell 230 by taking read word line 248 (one of read word lines 216 or 226 in FIG. 6) high with either row decoder 132 or 138 of FIG. 6 as appropriate and taking read column selection line 250 (one of read column selection lines 192 or 196 in FIG. 6) high with either column decoder and data selection logic 122 or 124 of FIG. 6 as appropriate. This turns on transistors 252 and 254 and causes the data in one-bit random access memory (RAM) cell 246 to flow to buffered read bit line 256 (one of read bit lines 218 or 228 in FIG. 6) via buffer 258.

Figure 7B:
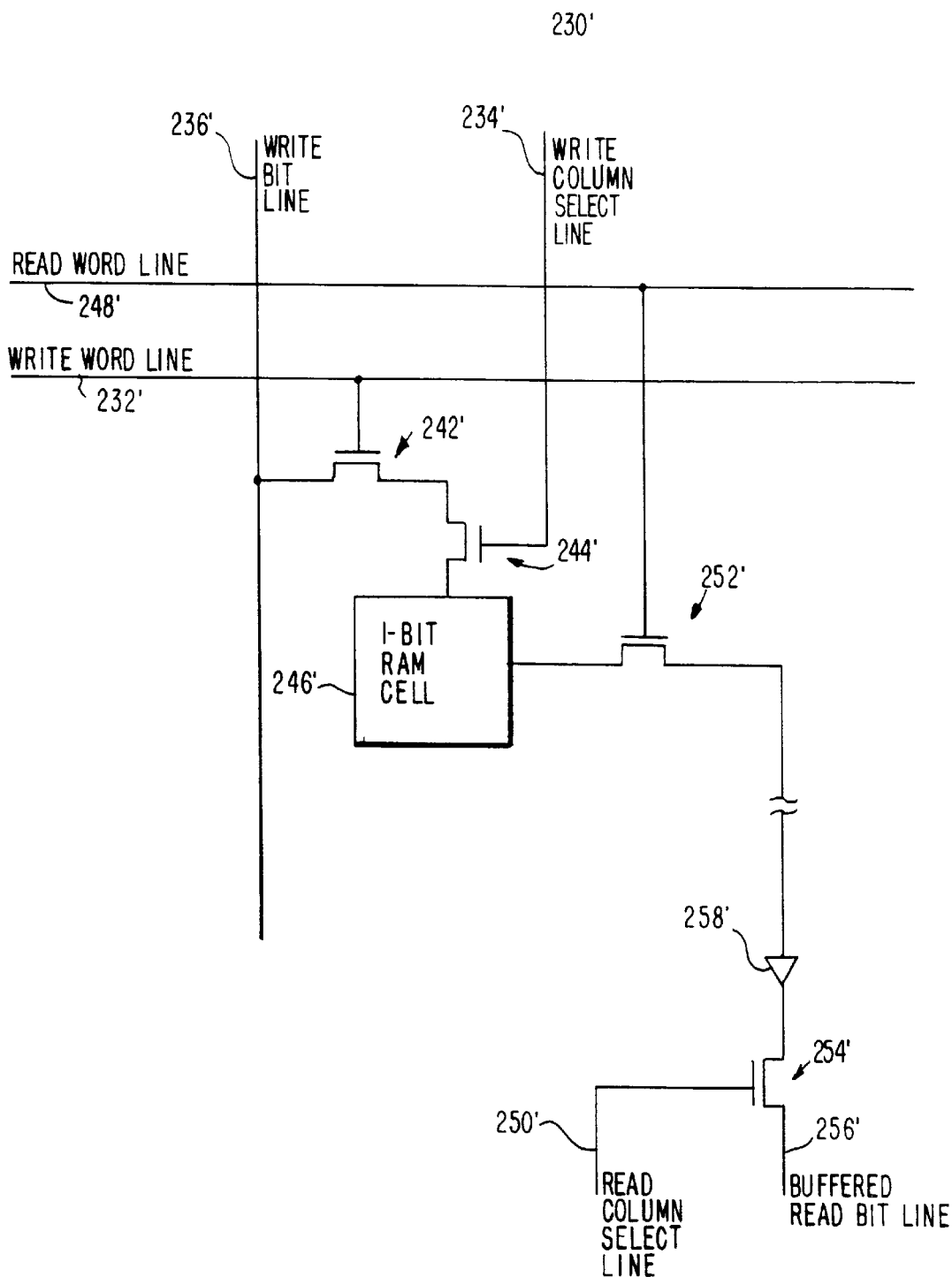
FIG. 7b is a diagram of another illustrative memory array cell for use in the memory arrays of FIG. 6 in accordance with the present invention.

Another suitable data storage cell arrangement for a cell in array 94 or 96 is shown in FIG. 7b. Data may be written into cell 230' by taking write word line 232' (one of write word lines 212 or 222 in FIG. 6) high with either row decoder 132 or 138 of FIG. 6 as appropriate and by taking write column selection line 234' (one of write column selection lines 190 or 194 in FIG. 6) high with either column decoder and data selection logic 122 or 124 of FIG. 6 as appropriate, while supplying data to cell 230' via write bit line 236' (one of write bit lines 238 or 240 in FIG. 6) using column decoder and data selection logic 122 or 124 of FIG. 6 as appropriate. This turns on transistors 242' and 244' and causes the data on write bit line 236' to flow into one-bit RAM cell 246'.

Data may be read from cell 230' by taking read word line 248' (one of read word lines 216 or 226 in FIG. 6) high with either row decoder 132 or 138 of FIG. 6 as appropriate and taking read column selection line 250' (one of read column selection lines 192 or 196 in FIG. 6) high with either column decoder and data selection logic 122 or 124 of FIG. 6 as appropriate. This turns on read word line selection transistor 252' and read column select line transistor 254' and causes the data in one-bit random access memory (RAM) cell 246' to flow to buffered read bit line 256' (one of read bit lines 218 or 228 in FIG. 6) via buffer 258'.

The memory cell arrangement of FIG. 7b is advantageous because only one row of transistors 254' is used per array 94 and only one row of transistors 254' is used per array 96. In particular, 16 transistors 254' may be used in each of arrays 94 and 96 and may be located along the bottom edge of each of arrays 94 and 96 as depicted in FIG. 6. The arrangement of FIG. 7a uses transistors 254 to control the reading of data from selected columns. However, the cell of FIG. 7a requires the use of a transistor 254 in each cell of arrays 94 and 96, rather than the single row arrangement of read column select line transistors 254' used with the cell of FIG. 7b.

Cells 230, cells 230', or any other suitable memory cell arrangement may be used if desired. For clarity, the present discussion focuses on use of memory cells 230, but this choice of memory cell is illustrative only.

When it is desired to combine the resources of memory arrays 84a and 84b of FIG. 6 to form a single dual-port variable depth and width memory array 86, the user may program the single-port/dual-port configuration bits applied to multiplexer control terminals 144, 148, 157, 161, 166, and 170 and control logic control terminals 152 and 174 accordingly. Setting the configuration bits to select dual-port mode causes multiplexers 142, 146, 155, 159, 164, and 168 to connect their "1" inputs to their outputs.

Setting the configuration bits to select dual-port mode also causes control logic 150 and 172 to generate corresponding control signals on outputs 154a, 156, 162, 176, 178a, and 184 that assist in placing arrays 84a and 84b in dual-port mode. Accordingly, control logic 150 turns on switches 160 and 182 (via multiplexer 159 and line 178b) and control logic 172 turns on switches 158 (via multiplexer 155 and line 154b) and 180. Control logic 150 directs column decoder and data selection logic 122 to act as a write column decoder and control logic 172 directs column decoder and data selection logic 124 to act as a read column decoder. Write operations may be performed with column decoder and data selection logic 122 at the same time that read operations may be performed with column decoder and data selection logic 124. In addition, the eight-bit data width handling capacity of array 94 is effectively doubled by the addition of the eight-bit data width handling capacity of array 96, so that sixteen-bit data words may be written into and read from the combined dual-port memory array formed from arrays 84a and 84b. The dual-port mode ability to handle concurrent read and write operations and the expanded data width of the combined array allow the user to implement logic functions on device 82 that would not otherwise be possible.

During write operations in dual-port mode, row addressing is handled by row decoder 132 based on the address information provided at input 210. Write operations involve taking one of row output lines 134 high to simultaneously select a row of array 94 (via switch 160) and the corresponding row of array 96 (via switch 160, multiplexer 164, and switch 182).

The write column select signals generated by column decoder and data selection logic 122 on write column select lines 190 when performing a write operation in dual-port mode are distributed simultaneously to both array 94 (directly) and array 96 (via multiplexer 168). One, two, four, or eight of the columns of memory cells 230 in array 94 may be selected at a time by using column decoder and data selection logic 122 in the x1, x2, x4, or x8 mode. While the columns of memory cells 230 in array 94 are selected, the same number of corresponding columns of memory cells 230 in array 96 are selected by the write column select signals distributed to array 96. Data for array 94 is provided from input registers 102 and data for array 96 is provided from input registers 112. Data words of sixteen bits in width (effectively x16 mode) may be handled by providing the eight most significant bits of each word to array 94 and by providing the associated eight least significant bits of each word to array 96. Data words of two bits in width may be handled by storing one bit of data in array 94 and one bit of data in array 96. Data words of four bits in width may be handled by storing two bits of data in array 94 and two bits of data in array 96. Data words of eight bits in width may be handled by storing four bits of data in array 94 and four bits of data in array 96.

Writing data into a given column of memory cells 230 of FIG. 7a involves taking the write column select line 234, for that column high while providing the data for the column to the write bit line 236 for the column using the data routing capabilities of column decoder and data selection logic 122 or 124. Column decoder and data selection logic 122 is used for writing in dual-port mode. The columns in each array that are selected when a group of more than one column of cells 230 is selected at a time are typically adjacent.

During read operations in dual-port mode, row addressing is handled by row decoder 138 based on the address information provided at input 220. Read operations involve taking one of row output lines 140 high to simultaneously select a row of array 96 (via switch 180) and the corresponding row of array 94 (via switch 180, multiplexer 142, and switch 158). Simultaneous read and write operations may involve simultaneously taking a row line 140 and a row line 134 high for the same row, provided that the columns of arrays 94 and 96 that are selected for reading differ from the columns that are selected for writing.

The read column select signals generated by column decoder and data selection logic 124 on read column select lines 196 when performing a read operation in dual-port mode are distributed simultaneously to both array 94 (via multiplexer 146) and array 96 (directly). In particular, while the columns of memory cells 230 in array 96 are selected, the same number of corresponding columns of memory cells 230 in array 94 are selected by the read column select signals distributed to array 94. This allows sixteen bit data words to be handled, because the eight most significant bits of each word may be read from array 94 at the same time that the associated eight least significant bits of each word are read from array 96. Data selected for reading from array 94 is provided to read data selection logic 198 and data selected for reading from array 96 is provided to read data selection logic 204.

Reading data from a given column of memory cells 230 of FIG. 7 involves taking the read column select line 250 for that column high while monitoring the buffered read bit line 256 for that column using read data selection logic 198 or 204 of FIG. 6. The columns in each array that are selected when a group of more than one column of cells 230 is selected at a time are typically adjacent.

Because the write column selection functions of column decoder and data selection logic 122 in the dual-port mode operate essentially independently from the read column selection functions of column decoder and data selection logic 124 and read data selection logic 198 and 204, one process implemented in programmable logic device 82 may be writing data to arrays 94 and 96 while another process implemented in programmable logic device 82 may be reading data from arrays 94 and 96 at the same time.

The ability of the dual-port variable depth and width array 86 to support simultaneous read and write operations is illustrated in FIG. 8. In the example of FIG. 8, a four-bit write operation is being performed at the same time that a four-bit read operation is being performed. When using dual-port memory array 86 for such four-bit concurrent read and write operations, memory arrays 94 and 96 may each be thought of as being partitioned into eight groups of columns. The capacity of array 94 is 1K. Each group in memory array 94 has a capacity of 128 bits organized as 64 words of two bits each. Similarly, the capacity of array 96 is 1K. Each group in memory array 96 has a capacity of 128 bits organized as 64 words of two bits each. When reading four bits, two bits are retrieved from location 260 (e.g., in group 3) of memory array 94 in the selected row for reading and two bits are retrieved from location 262 (e.g., in group 3) of memory array 96 in the selected row for reading. When writing four bits, two bits are stored at location 264 (e.g., in group 2) of memory array 94 in the selected row for writing and two bits are stored at location 266 (e.g., in group 2) of memory array 96 in the selected row for writing.

The locations for reading a desired four-bit data word can be specified by taking two of the read column select lines 196 high using column decoder and data selection logic 124. These two column select lines are connected both to array 94 (via multiplexer 146) and array 96 (directly). Row decoder 138 specifies the desired row from which data in arrays 94 and 96 may be read. Row decoder 138 is connected to array 96 directly and is connected to array 94 via multiplexer 142.

The locations for writing a desired four-bit data word can be specified by taking two of the write column select lines 190 high using column decoder and data selection logic 122. These two column select lines are connected both to array 94 (directly) and array 96 (via multiplexer 168). Row decoder 132 specifies the desired row of arrays 94 and 96 into which data may be written. Row decoder 132 is connected to array 94 directly and is connected to array 96 via multiplexer 164.

Memory arrays 94 and 96 can each be partitioned into sixteen one-bit groups when array 86 is operated as a two-bit width dual-port memory array. When array 86 is operated as an eight-bit width dual-port memory array, memory arrays 94 and 96 can each be partitioned into four four-bit groups. When array 86 is operated as a sixteen-bit width dual-port memory array, memory arrays 94 and 96 can each be partitioned into two eight-bit groups.

To handle sixteen bit data words, arrays 94 and 96 are operated in the x8 mode. The eight most significant bits of each sixteen bit data word are loaded into registers 102, from which this data may be written into an appropriate location associated with either of the two eight-bit groups of columns in array 94. The eight least significant bits of each sixteen bit data word are loaded into registers 112, from which this data may be written into a corresponding location associated with either of the two eight-bit groups of columns in array 96.

The ability of the dual-port memory array arrangement of FIG. 6 to perform concurrent read and write operations allows the user of programmable logic device 82 to implement first-in-first-out buffers and other such memory arrangements. When the user does not need a dual-port memory array, but needs more available single-port memory arrays, the dual-port memory array arrangement of FIG. 6 may be operated as two independent single-port memory arrays.

Figure 9:
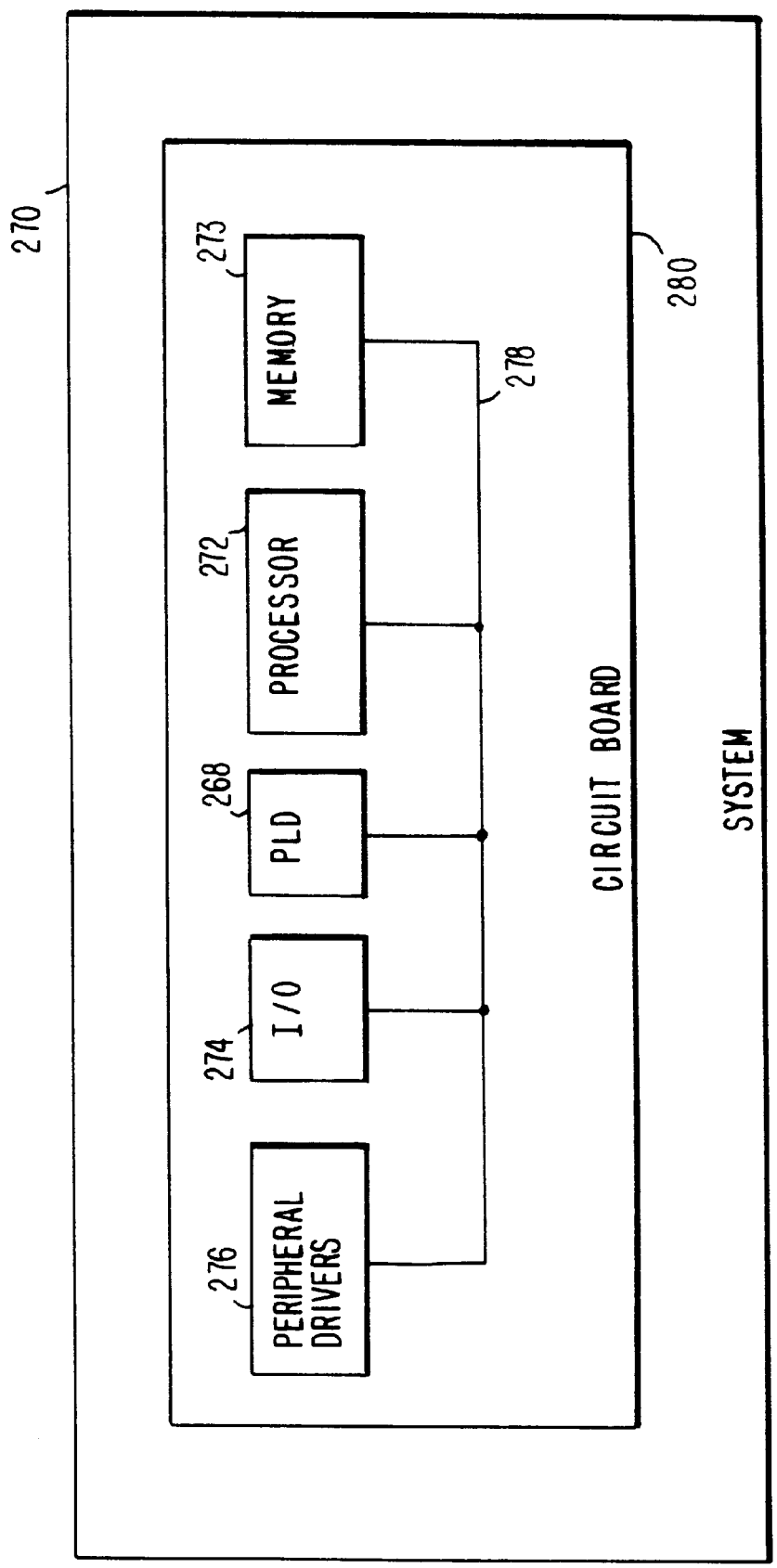
FIG. 9 is a diagram of a system in which a programmable logic device having the combinable single-port memory array circuitry of the present invention may be used.

The foregoing arrangements are typically used in programmable logic devices that are made part of larger systems. FIG. 9 shows a programmable logic device 268 containing the combinable single-port memory array circuitry of this invention in use in a data processing system 270. Data processing system 270 may include one or more of the following components: a processor 272, memory 273, I/O circuitry 274, and peripheral drivers 276. These components are coupled together by a system bus 278 and populate a circuit board 280 that is contained in system 270.

System 270 may be used in a wide variety of applications, such as computer networking, data networking, instrumentation, video processing, digital signal processing, or any other application where the advantage of using programmable logic is desirable. Programmable logic device 268 may be used to perform a variety of different logic functions. For example, programmable logic device 268 may be configured as a processor or controller that works in cooperation with processor 272. Programmable logic device 268 may also be used as an arbiter for arbitrating access to a shared resource in system 270. In yet another example, programmable logic device 268 may be configured as an interface between processor 272 and one of the other components in system 270.

The programmable connections made between various components in the programmable logic devices of the present invention can be implemented in any of a wide variety of ways. For example, each programmable connection can be a relatively simple programmable connector such as a switch or a plurality of switches for connecting any one of several inputs to an output. Each such connection may be configured using a memory cell such as a random-access memory cell. Alternatively, programmable connectors can be somewhat more complex elements which are capable of performing logic (e.g., by logically combining several of their inputs) as well as making connections. For example, each programmable connection can use product term logic, implementing functions such as AND, NAND, OR, or NOR. Examples of components suitable for implementing programmable connections are erasable programmable read-only memories (EPROMs), electrically-erasable programmable read-only memories (EEPROMs), pass transistors, transmission gates, antifuses, laser fuses, metal optional links, etc. These programmable components may be controlled by various programmable function control elements or memory cells, which store the configuration data used to control the programmable components. Examples of suitable function control elements include static random-access memory (SRAM) cells, dynamic random-access memory (DRAM) cells, first-in first-out cells, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable both to one-time-only programmable and reprogrammable devices.

The foregoing is merely illustrative of the principles of this invention and various modifications can be made by those skilled in the art without departing from the scope and spirit of the invention. For example, the number of rows and columns of memory array cells that are used is not critical. In addition, the various data width modes used in the variable depth and width memory arrays are illustrative. Modes supporting different word sizes may be used if desired.

What is claimed is:

1. A programmable logic device comprising:
   a plurality of programmable logic regions wherein the plurality of programmable logic regions are arranged in intersecting rows and columns;
   a plurality of first combinable single-port memory arrays each having a plurality of rows and columns of memory cells for storing data;
   a plurality of second combinable single-port memory arrays each associated with a respective one of the first combinable single-port memory arrays and each having a plurality of rows and columns of memory cells for storing data, wherein the first and second combinable single-port memory arrays are combinable to form a plurality of dual-port memory arrays and wherein the first and second combinable single-port memory arrays are arranged in intersecting rows and columns; and
   a plurality of interconnects for routing signals between the programmable logic regions and the first and second combinable single-port memory arrays.

2. The programmable logic device defined in claim 1 wherein:
   the first combinable single-port memory arrays each have a maximum data width;
   the associated second combinable single-port memory arrays each have a maximum data width; and the dual-port memory arrays formed from the first and second combinable single-port memory arrays each have a maximum data width greater than the maximum data width of either the first combinable single-port memory arrays or the second single-port memory arrays taken alone.

3. The programmable logic device defined in claim 1 wherein the first and second combinable single-port memory arrays are combinable using circuitry from respective ones of the first combinable single-port memory arrays to perform writing operations and using circuitry from respective ones of the second combinable single-port memory arrays that are associated with each of the first combinable single-port memory arrays to perform concurrent reading operations.

4. The programmable logic device defined in claim 1 wherein the first and second combinable single-port memory arrays comprise variable depth and width memory arrays.

5. The programmable logic device defined in claim 1 wherein at least one of the first combinable single-port memory arrays and one of the second combinable single-port memory arrays are in each of the rows.

6. The programmable logic device defined in claim 1 wherein the first and second combinable single-port memory arrays further comprise:
   first input multiplexing circuitry for distributing data signals to respective ones of the first combinable single-port memory arrays; and
   second input multiplexing circuitry for distributing data signals to respective ones of the second combinable single-port memory arrays.

7. The programmable logic device defined in claim 1 wherein the first and second combinable single-port memory arrays further comprise:
   first input registers for registering data to be written to respective ones of the first combinable single-port memory arrays; and
   second input registers for registering data to be written to respective ones of the second combinable single-port memory arrays.

8. The programmable logic device defined in claim 1 wherein the first and second combinable single-port memory arrays further comprise:
   first output registers for registering data that has been read from respective ones of the first combinable single-port memory arrays; and
   second output registers for registering data that has been read from respective ones of the second combinable single-port memory arrays.

9. The programmable logic device defined in claim 1 wherein the first memory arrays further comprise:
   a write column select line associated with each column of each memory array for controlling the transfer of data into the cells of that column; and
   a read column select line associated with each column of each memory array for controlling the transfer of data from the cells in that column, wherein the write column select line and the read column select line operate independently.

10. The programmable logic device defined in claim 1 wherein the second memory arrays further comprise:
    a write column select line associated with each column of each memory array for controlling the transfer of data into the cells of that column; and
    a read column select line associated with each column of each memory array for controlling the transfer of data from the cells in that column, wherein the write column select line and the read column select line operate independently.

11. The programmable logic device defined in claim 1 wherein:
    the first combinable single-port memory arrays further comprise a first write column select line associated with each column of each first combinable memory array for controlling the transfer of data into the cells of that column and a first read column select line associated with each column of each first memory array for controlling the transfer of data from the cells in that column, wherein the first write column select line and the first read select line operate independently; and
    the second combinable single-port memory arrays further comprise a second write column select line associated with each column of each first memory array for controlling the transfer of data into the cells of that column and a second read column select line associated with each column of each second memory array for controlling the transfer of data from the cells in that column, wherein the second write column select line and the second read select line operate independently.

12. The programmable logic device defined in claim 1 wherein:
    the first and second combinable single-port memory arrays are combinable using circuitry from respective ones of the first combinable single-port memory arrays to perform writing operations and using circuitry from respective ones of the second combinable single-port memory arrays that are associated with each of the first combinable single-port memory arrays to perform concurrent reading operations; and
    the circuitry from each of the first combinable single-port memory arrays that is used to perform dual-port memory array writing operations comprises variable depth and width writing circuitry for performing write operations with selectable-size data words by addressing selected write locations within the rows and columns of cells in the first combinable single-port memory array and by writing data words into those write locations; and
    the circuitry from each of the second combinable single-port memory arrays that is used to perform dual-port memory array reading operations comprises variable depth and width reading circuitry for performing read operations with selectable-size data words concurrently with the write operations performed by the variable depth and width writing circuitry by addressing selected read locations within the rows and columns of cells in the second combinable single-port memory array and by reading data words from those read locations.

* * * * *